United States Patent [19]

Takebe

[11] Patent Number: 5,869,905

[45] Date of Patent: *Feb. 9, 1999

[54] MOLDED PACKAGING FOR SEMICONDUCTOR DEVICE AND METHOD OF MANUFACTURING THE SAME

[75] Inventor: Naoto Takebe, Kanagawa-ken, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 782,259

[22] Filed: Jan. 14, 1997

[30] Foreign Application Priority Data

Jan. 15, 1996 [JP] Japan .................................. 8-021900

[51] Int. Cl.⁶ ........................... H01L 23/48; H01L 23/54; H01L 29/40
[52] U.S. Cl. ......................... 257/787; 257/780; 257/782; 257/784
[58] Field of Search .................................. 257/691, 787, 257/788, 666, 693, 782, 780, 784; 438/124, 127

[56] References Cited

U.S. PATENT DOCUMENTS 5,565,709  10/1996  Fukushima et al. ..................... 257/788

FOREIGN PATENT DOCUMENTS

| 3249345 | 10/1988 | Japan | 257/787 |
| 1082656 | 3/1989 | Japan | 257/787 |
| 1106456 | 4/1989 | Japan | 257/787 |
| 3004543 | 1/1991 | Japan | 257/787 |
| 3024752 | 1/1991 | Japan | 257/787 |
| 3297163 | 12/1991 | Japan | 257/666 |

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

One end of bonding wires made of aluminium, gold, etc., is connected to a plurality of electrode pads formed on the main surface of a semiconductor chip. The other end of these bonding wires is exposed on the surface of the molded resin unit. Connecting electrodes made of aluminium are formed on top of the exposed parts of these bonding wires. The semiconductor chip and external circuitry are connected electrically by means of these connecting electrodes.

17 Claims, 10 Drawing Sheets

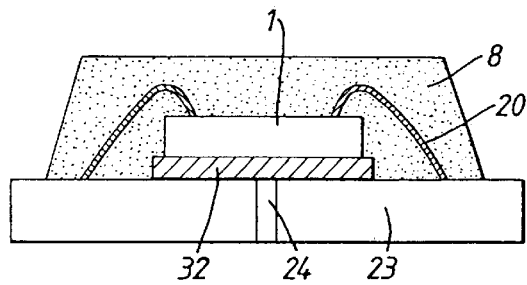
Fig. 15(a)
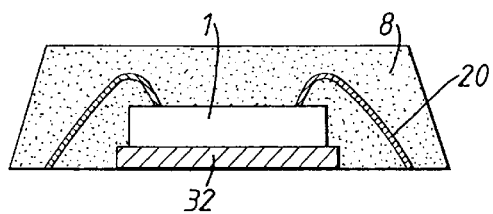 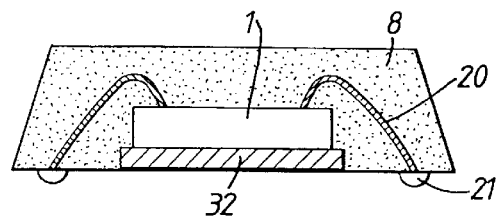
Fig. 15(b)   Fig. 15(c)
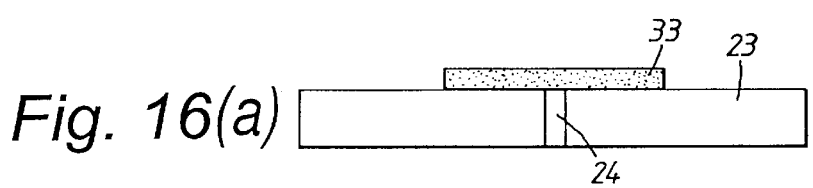
Fig. 16(a)
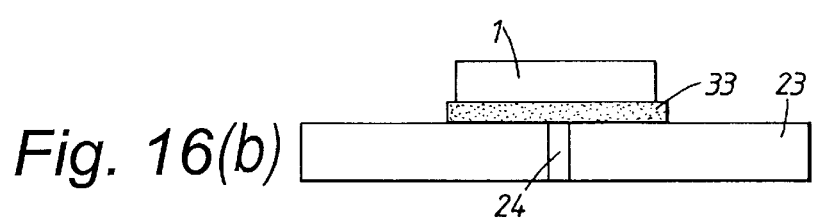
Fig. 16(b)
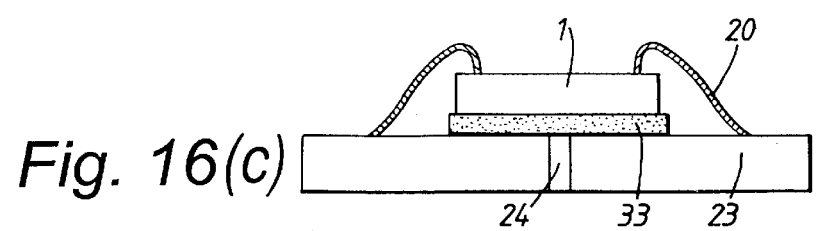
Fig. 16(c)

MOLDED PACKAGING FOR SEMICONDUCTOR DEVICE AND METHOD OF MANUFACTURING THE SAME

FIELD OF THE INVENTION

The present invention relates to a molded semiconductor device and a process for the production thereof, wherein the molded semiconductor device uses bonding wires, that are directly connected to external electrodes on the surface of the semiconductor elements, as external terminals for connection to external circuitry.

BACKGROUND OF THE INVENTION

Molded semiconductor devices are created by means of steps such as: a dicing step in which individual semiconductor elements (semiconductor chips) formed on a wafer are separated out; a die bonding step in which the separated individual semiconductor chip is loaded onto a lead frame; a wire bonding step in which electrical connection is made between electrode pads on the semiconductor chip and the inner leads of the lead frames using fine wire such as gold wire, aluminium wire, etc.; and a packaging step in which the semiconductor chip, the fine wires attached to the semiconductor chip and the inner leads are sealed in resin. Generally the method used for sealing the semiconductor chip in resin is the pressure molding method, the potting method, the transfer molding method, or the like.

FIG. 1 shows a prior art molded semiconductor device which is a small outline package (SOP) device. The semiconductor chip (1) is anchored by means of a conducting adhesive to the lead frame's (2) die pad part (3), which carries the semiconductor element. The lead frame (2) is equipped with an inner lead part (6) within the molded resin unit and an outer lead part (9) outside of the molded resin unit (molding compound). The semiconductor chip (1), the die pad part (3), the inner lead part (6), etc., are encased and protected by the molded resin unit (8).

The molded resin unit (8) comprises, for example, epoxy resin, etc., and is formed by a method such as the transfer molding method. In addition, the outer lead part (9) is formed so that connection between the tips and external circuitry can be easily achieved. The inner lead part (6) in arranged so that within the molded resin unit (8) the tips thereof face towards the semiconductor chip (1). Also, the bonding tip parts of the inner lead part (6) are connected to external electrodes (5) (for example, electrode pads) formed on the main surface of the semiconductor chip, by means of bonding wires (7) made of gold, aluminium, or the like. On the main surface of the semiconductor chip (1) the external electrodes (5) are surrounded by an insulating layer (15) comprising $SiO_2$ or the like.

Next, a prior art molding process which involves the loading of chips onto lead frames will be explained with reference to FIGS. 2 and 3. FIG. 2 shows a plan of a lead frame loaded into a die, FIG. 3 shows a cross section of a lead frame positioned in the cavity of a die, and comprises a cross section corresponding to the line A–A' in FIG. 2. The lead frame (2) is formed by etching or cutting raw material such as copper, iron—42 wt.% nickel alloy, or the like, in sheet or coil form. Etching is carried out in accordance with a resist pattern formed on the raw material, and the inner lead tips are completed by surface processing involving plating with gold or silver. Similarly, with the cutting method, the raw material is patterned to form the shape of the lead frame using a cutting die.

The lead frame (2) comprises an outer frame (10), a die pad (3) onto which the semiconductor chips (1) are loaded, inner leads (6) which are sealed in the molded resin unit, and outer leads (9) which Lead out from the molded resin unit, and is a long body formed by repeating these parts as single units. Semiconductor chip (1) is bonded to the die pad (3), and the semiconductor chip (1) electrode pads (external electrodes, not shown) are connected to the inner leads (6) by means of bonding wires (7). With the lead frame (2) set up in the transfer molding die (12), the lead frame's (2) inner leads (6), die pad (3) and die pad (3) support pins (11) are accommodated within the cavity (16) formed by the depressions in the top die (13) and the bottom die (14) (the extent of this cavity is shown by the dotted line in FIG. 2. This cavity (16) is filled with the resin that forms the molded resin unit. The entrance gate (17) through which the resin is injected into this cavity (16) is formed in the shorter aide of the rectangular cavity (16). This gate is located along the line A–A' in FIG. 2. The semiconductor device's resin sealed package changes very little in contrast to the tendency of the semiconductor chip to become highly dense and expand. Accordingly the proportion occupied by the semiconductor chip within the molded resin unit increases, and in particular with semiconductor devices that use thin packaging, it is difficult to seal the resin uniformly.

In addition, as stated above, with prior art molded semiconductor devices, semiconductor chips are sealed in resin using a lead frame. However, with the package of FIG. 1, because of the use of lead frames and substrates, a lead frame or substrate must be manufactured for each product, and a considerable amount of time must be set aside for the design and production of these. Also, the reality is that because the thickness of the lead frame or substrate is quite considerable compared to the thickness of the total package, it is difficult to produce ultra-thin packages.

SUMMARY OF THE INVENTION

It is an object of the present invention to provide a molded semiconductor device that makes it possible to achieve ultra-thin packages rapidly and at low cost.

To achieve the above object, the present invention provides a molded semiconductor device which comprises a semiconductor chip, a plurality of bonding wires wherein one end of each bonding wire is coupled to the semiconductor chip, and a molding compound encasing the semiconductor chip and the bonding wires, wherein another end of each bonding wire is exposed directly to a surface of the molding compound.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which:

FIGS. 15(a), 15(b) and 15(c) show cross sections of steps in the production of the molded semiconductor device of Embodiment 3;

FIG. 16(a), 16(b) and 16(c) show cross sections of steps in the production of the molded semiconductor device of Embodiment 4;

DETAILED DESCRIPTION OF PREFERRED EMBODIMENTS

Embodiments of the present invention will be described in detail with reference to the drawings.

Figure 1:
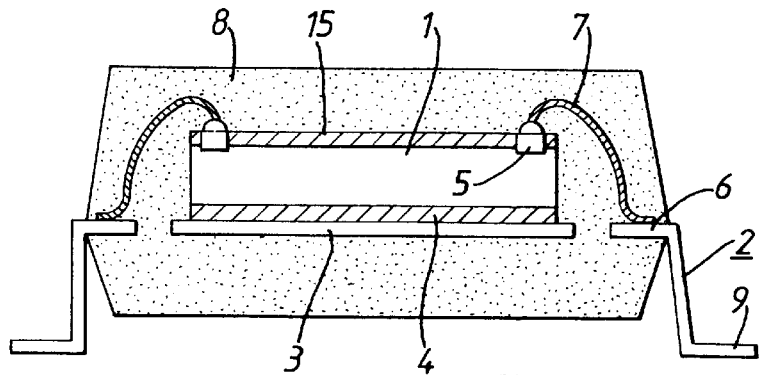
FIG. 1 shows a cross section of a prior art small outline package type semiconductor device.
Figure 2:
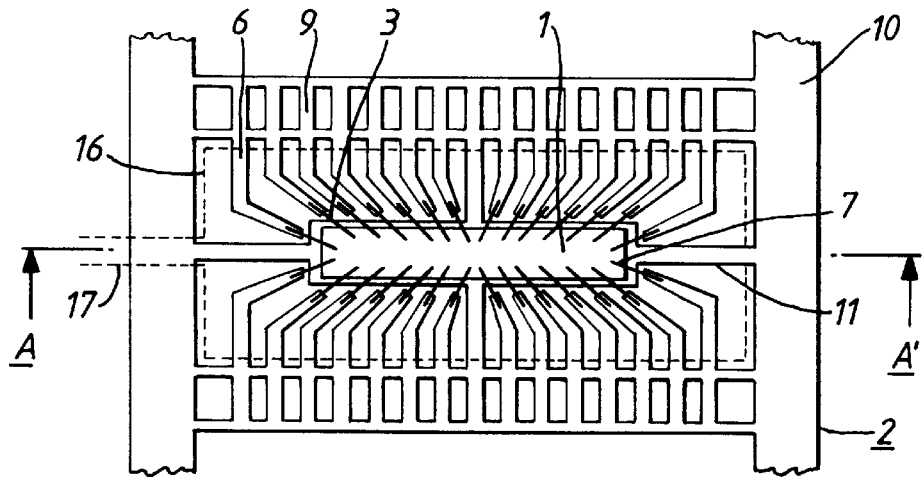
FIG. 2 shows a plan of a prior art lead frame.
Figure 3:
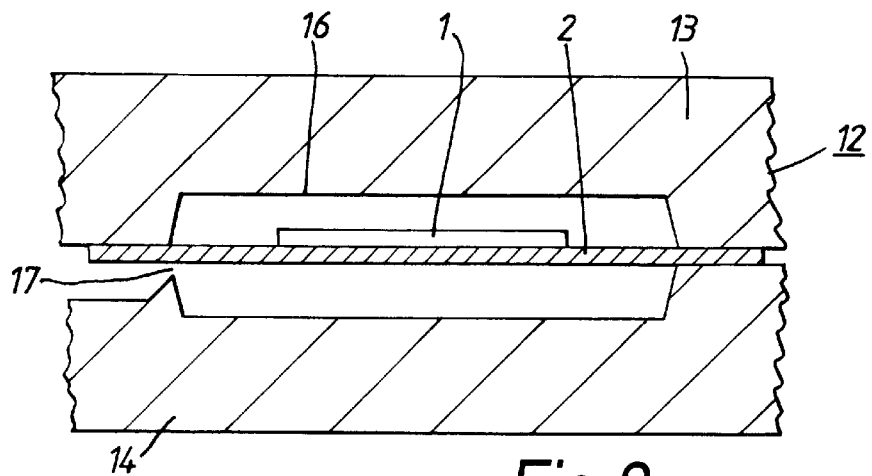
FIG. 3 shows a cross section of a prior-art resin die
Figure 4:
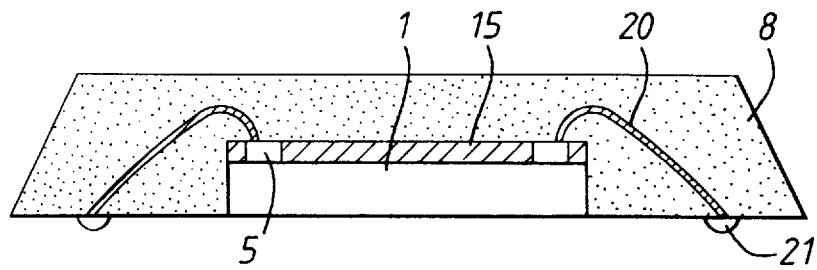
FIG. 4 shows a cross section of the molded semiconductor device of Embodiment 1 of the present invention.
Figure 5:
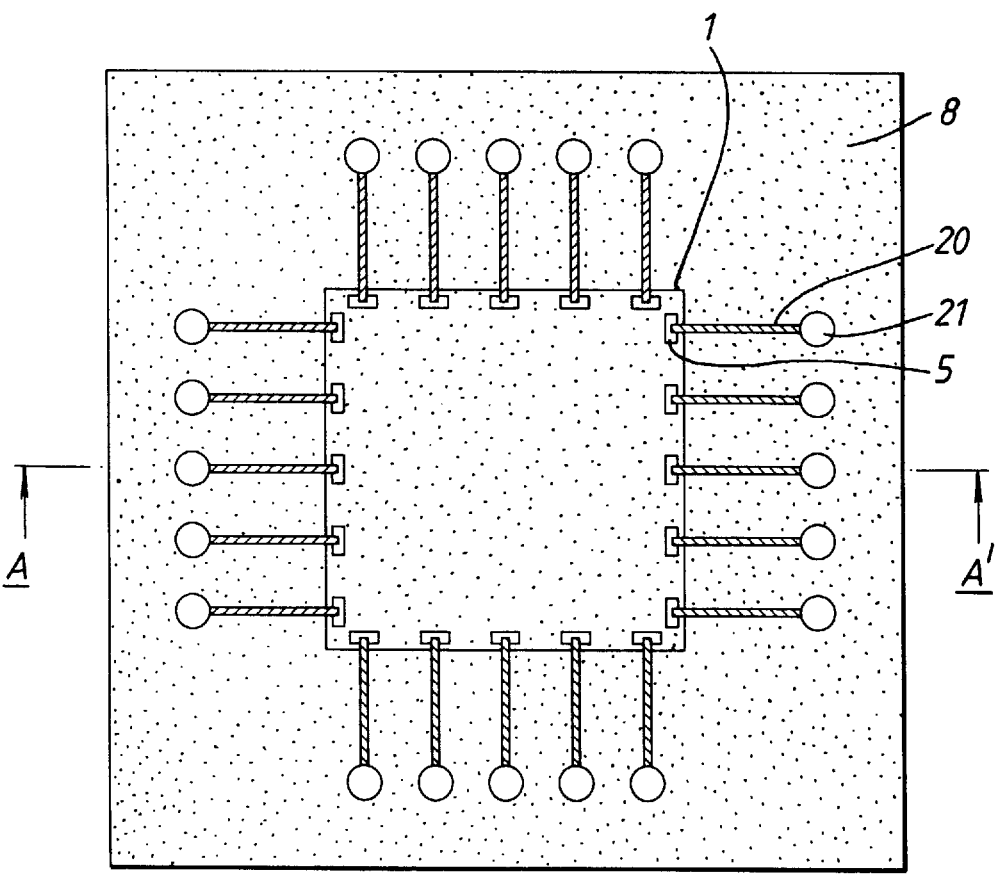
FIG. 5 shows a plan of the molded semiconductor device of Embodiment 1.

First of all, the first Embodiment will be described with reference to FIG. 4 and 5. FIG. 4 shows a cross section of a molded semiconductor device, and figure 5 shows a plan of a molded semiconductor device. FIG. 4 shows a cross section along the line A–A' on FIG. 5. A semiconductor chip (1), which has been cut from a wafer, has, for example, a silicon semiconductor as its substrate.

To a plurality of electrode pads (5) (external electrodes) formed on the main surface of a semiconductor chip (1) are attached one end of bonding wires (20) comprising fine metal wire made of aluminium, gold, or the like. The electrode pads (5) are surrounded by an insulating layer (15) made of $SiO_2$ or the like, which is formed on the main surface of the semiconductor chip (1). The other ends of the bonding wires (20) are exposed on the surface of the molded resin unit (8) which is made from epoxy resin material or the like. Connecting electrodes (21) comprising solder balls, or the like, are formed on top of the exposed parts of these bonding wires (20), and through these connecting electrodes electrical connection is made between external circuitry and the integrated circuits which have been formed inside the semiconductor chip (1). In this Embodiment said other ends of the bonding wires (20) are exposed on the bottom surface of the molded resin unit (8).

Because lead frames are not included within the molded resin unit and the bonding wires are exposed from the molded resin unit and are directly connected to connecting electrodes, the molded resin unit can be made thinner and the connecting electrodes arranged at a high density. Since lead frames are not used, the time required for producing lead frames is eliminated and the cost can be reduced.

Figure 6A:
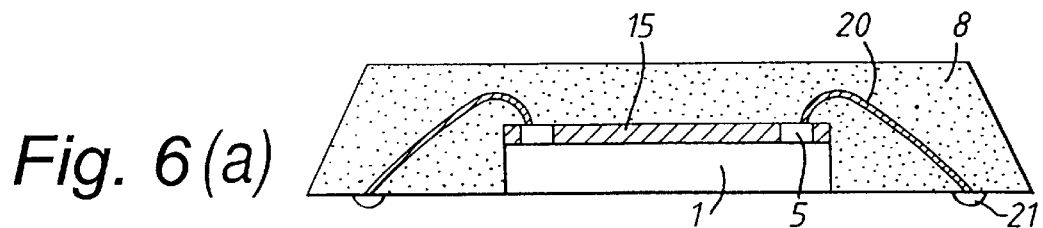
FIGS. 6(a) and 6(b) show cross sections of the molded semiconductor device of Embodiment 2.
Figure 6B:
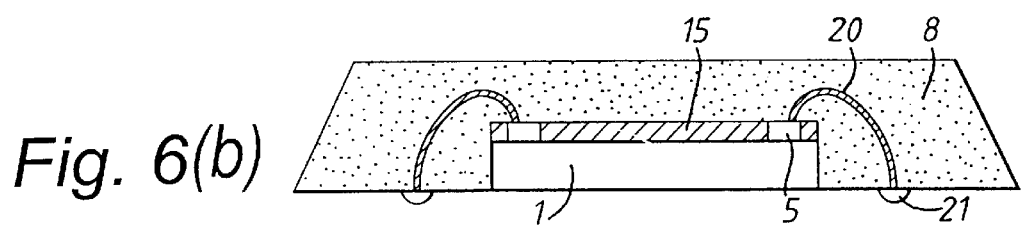
Figure 7:
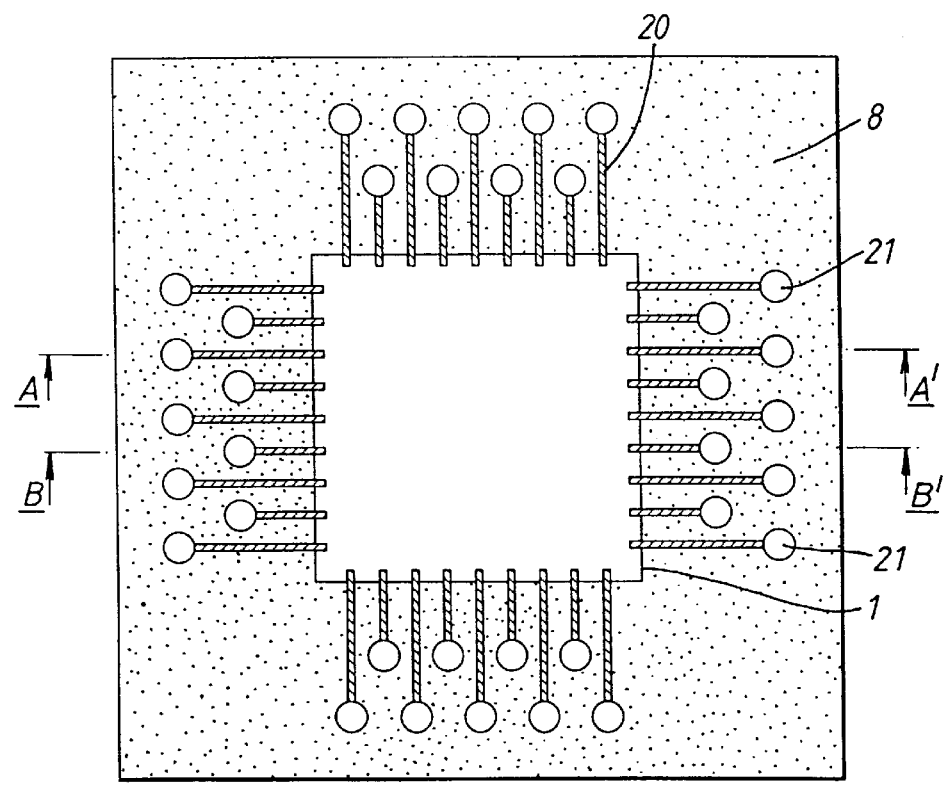
FIG. 7 shows a plan of the molded semiconductor device of Embodiment 3.
Figure 8A:
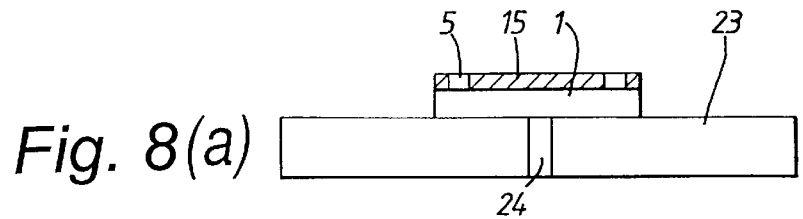
FIGS. 8(a) and 8(b) show cross sections of steps in the production of molded semiconductor devices of this invention.
Figure 8B:
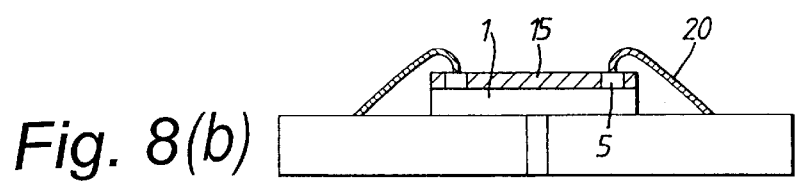

Next, the second Embodiment will be described with reference to FIGS. 6 and 7. FIG. 7 shows a plan of a molded semiconductor device, FIG. 6(a) shows a cross section of a molded semiconductor device along the line A–A', and FIG. 6(b) shows a cross section of a molded semiconductor device along the line B–B'. The semiconductor chip (1), which has been cut from a wafer, has as its substrate, a silicon semiconductor or the like. To a plurality of electrode pads (5) (external electrodes) formed on the main surface of the semiconductor chip (1) are attached one end of bonding wires (20) comprising fine metal wire made of aluminium, gold, or the like. The electrode pads (3) are surrounded by an insulating layer (15) made of $SiO_2$ or the like, which is foxed on the main surface of the semiconductor chip (1). The other ends of the bonding wires (20) are exposed on the bottom surface of the molded resin unit which is made from epoxy resin material or the like. Connecting electrodes (21) comprising solder balls, or the like, are formed on top of the exposed parts of these bonding wires (20) and through these connecting electrodes electrical connection is made between external circuitry and the integrated circuits that have been formed inside the semiconductor chip (1). In this Embodiment the other ends of the bonding wires (20) are exposed on the bottom surface of the molded resin unit (8).

Because lead frames are not contained within the molded resin unit and the bonding wires are exposed on the surface of the molded resin unit and are directly connected to connecting electrodes, the molded resin unit can be made thinner and the connecting electrodes arranged at a high density. Also, because lead frames are not used, the time required for producing lead frames is eliminated and the cost can be reduced. Moreover, in this Embodiment, bonding wires (20) coated with an insulating layer of polymide, or the like, are used, the other ends of the bonding wires are exposed on the bottom surface of the molded resin unit (8), and connecting electrodes (21) are formed on these parts. Furthermore, these connecting electrodes are arranged in zigzag patterns. As a result of this zigzag arrangement of connecting electrodes (21) the problem of contact between bonding wires (20) arises, but shorting between bonding wires does not occur during manufacture because the bonding wires (20) are coated with an insulating layer.

Figure 12:
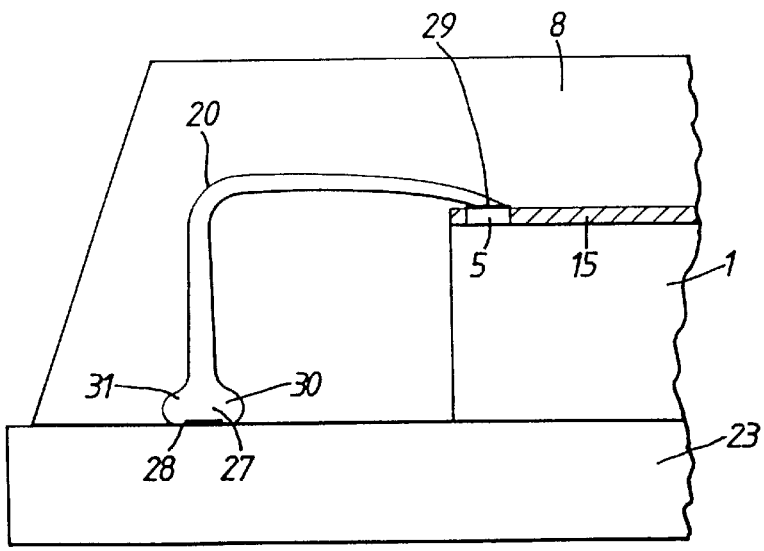
FIG. 12 is a partial cross section of a molded semiconductor device of this invention.
Figure 13:
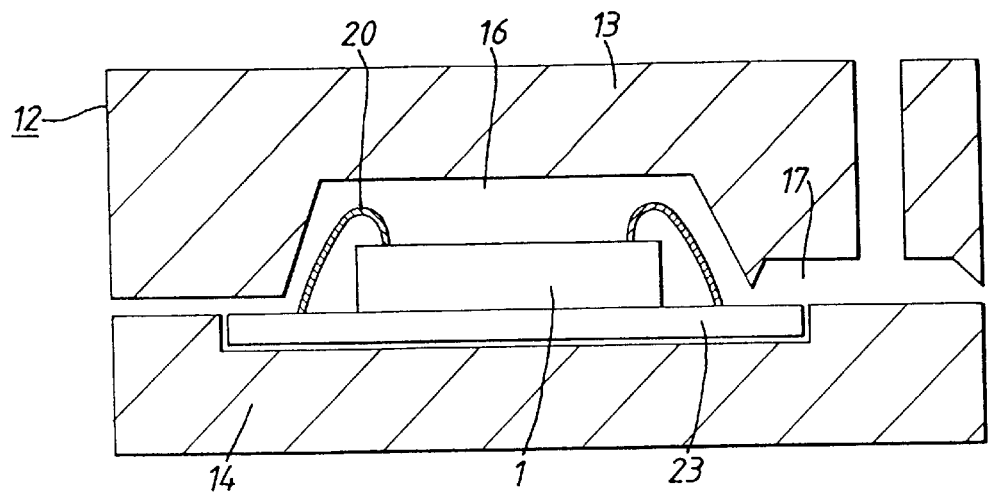
FIG. 13 shows a cross section of a resin die for carrying out resin sealing of this invention.

Next, the method of producing the molded semiconductor device of the first Embodiment will be described with reference to FIGS. 8 to 13. FIGS. 8 to 11 show cross sections of the molded semiconductor device at steps in the production of molded semiconductor devices, FIG. 12 shows a cross section depicting bonding wire connections, and FIG. 13 shows a cross section of a resin die (transfer molding die). In the centre of the plate (23) of the semiconductor production device used to produce this semiconductor device there is through-hole (24) which is smaller than the semiconductor chip (1) loaded onto the plate (23). After the semiconductor chip (1) has been loaded on, the semiconductor chip (1) is secured in position by auction due to the application of a vacuum to the semiconductor chip (1) though the through-hole (24). The electrode pads and one end of the bonding wires (20) are joined using a bonding tool (bonding head) (not shown), and the other ends of the bonding wires (20) are temporarily attached to the plate (23). For the plate (23), a metal plate, heat resistant plastic plate or glass plate is used. As a metal plate, there is, for example, a metal plate with a silver-plated surface, made from copper alloy or Fe—42 wt.% Ni alloy material. To attach temporarily the tips of the bonding wires (20) to the plate (23), there is carried out, for example, temporary attachment by means of metal bonding to the silver-plated plate surface. Alternatively a method using solder paste can implemented, FIG. 9 shows a cross section showing how attachment can be achieved using solder paste.

Figures 9A, 9B:
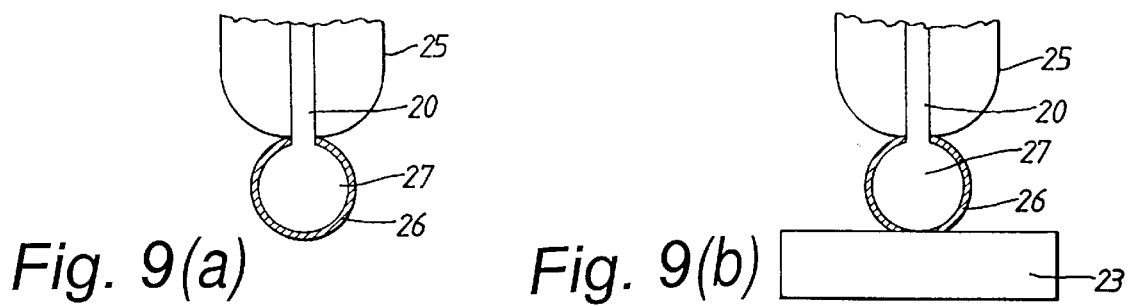
FIGS. 9(a), 9(b) and 9(c) show cross sections of steps in the production of molded semiconductor devices of this invention.
Figure 9C:
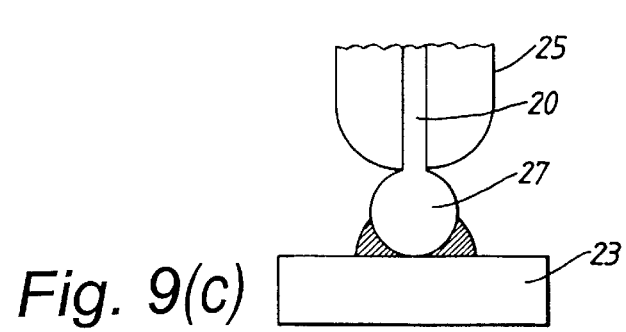

First, solder paste is coated onto the tip (ball) (27) of a bonding wire (20) contained in a bonding tool (bonding head) (25) (FIG. 9(a)). This tip (27) became ball-shaped at the cutting step of the previous bonding. The solder paste layer may be formed by immersing this tip (27) into solder paste in a solder tank. Next, the tip (27) is pressed onto the surface of the plate (23) (FIG. 9(b)), then the solder paste (26) is melted by heating and the tip (27) fixed onto the plate (23) (FIG. 9(c)).

Figure 10A:
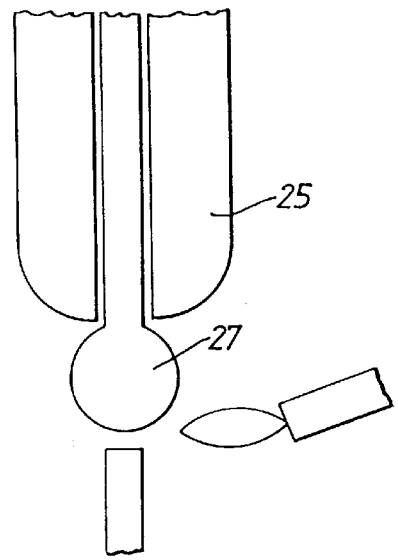
FIGS. 10(a) and 10(b) show cross sections of steps in the production of molded semiconductor devices of this invention.
Figure 10B:
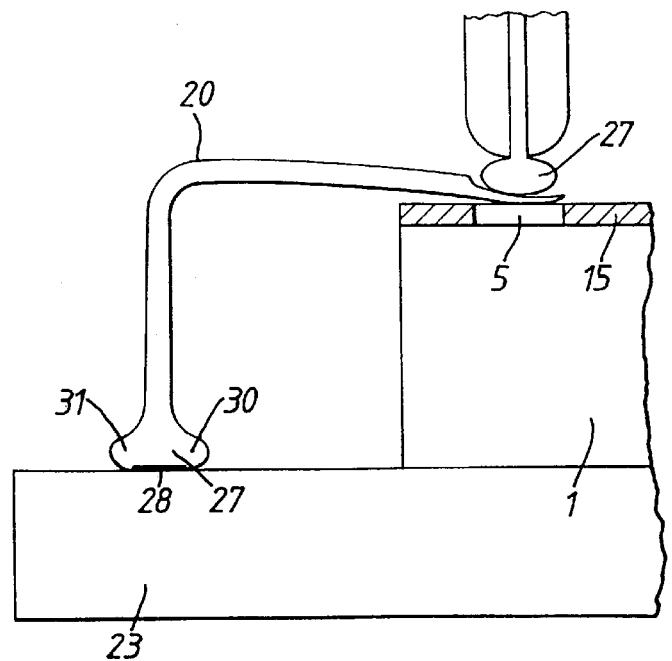
Figure 11A:
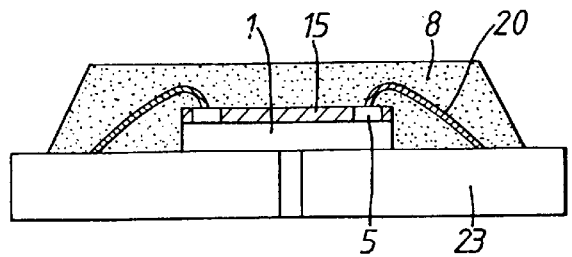
FIG. 11(a), 11(b), 11(c) show cross sections of steps in the production of molded semiconductor devices of this invention.
Figure 11B:
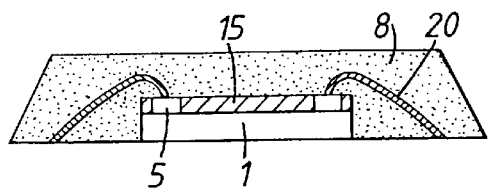
Figure 11C:
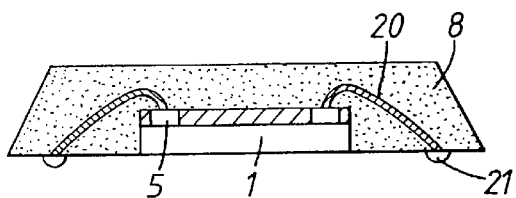

Next, the method of connecting the bonding wire to the plate and the semiconductor chip will be described with reference to FIG. 10(b). First, the tip (27) of a bonding wire (20) contained in a bonding tool (25) is fixed to the plate (23) using, for example, the method shown in FIG. 9. Then, the bonding wire (20) is drawn out of the bonding tool (25) and placed on top of an electrode pad (5) on the main surface of the semiconductor chip (1). The bonding wire (20) is pressed onto the electrode pad (5), and as well as joining both together using heat crimping, the joined part of the bonding wire is cut off from the part of the bonding wire contained in the bonding tool, and the electrode pad (5) and the plate (23) are connected by the bonding wire (20).

Next, with the electrode pads (5) joined to one end of the bonding wires (20) and the other ends of the bonding wires (20) temporarily attached to the plate (23), the plate (23) on which the semiconductor chip (1) is fixed is inserted into the resin die (transfer molding die). Then, for example, using the transfer molding method, the die is filled with fluid resin, and a molded resin unit (8) is formed (FIG. 11(a)). After taking the molded product (molding compound) out of the die, the plate (23) is detached from the molded resin unit (8). This action exposes the area where the bonding wires (20) were attached to the plate (23) on the surface of the molded resin unit (8) (FIG. 11(b)). These exposed parts of the tips of the bonding wires (20) are used as the semiconductor device's connecting electrodes. Moreover, connecting electrodes (21) such as solder balls may be formed on these exposed parts (FIG. 11(c)).

It is desirable that the plate (23) used above has properties that promote bonding with the bonding wires, and materials that do not readily adhere to the molded resin unit are desirable. An example would be the use of gold wire as the bonding wire and a plate surface which has been plated with extremely thin silver plating, or the like. In addition, there is no need to construct circuitry on the plate (23) in advance, and therefore, even if the type of semiconductor device is changed there is no need to change the plate (23) used, so a single type of plate can be used in common, and a reduction in costs can be achieved.

Next, the details of the joining parts of the bonding wires that connect the plate and the semiconductor chip will be described with reference to FIG. 12. Ball bonding is used to join the bonding wires. By making the first join (28) between the bonding wire (20) and the plate, and then in the next step making the second join (29) between the bonding wire and the semiconductor chip, a wallow electrode size can be formed when the plate (23) is detached. In addition, damage to the part created as an electrode when the plate (23) is detached can be prevented because the deformed ball (30) formed at the tip (27) exposed from the molded resin unit (8) forms a wedge shape (31) relative to the molded resin unit (8).

Next, the resin die used to form the molded resin unit on top of the plate shown in FIG. 11 will be described with reference to FIG. 13. The resin die (12) is constructed of a top die (13) and a bottom die (14), and when both of these dies are brought together a cavity (16) is formed. The die used in this Embodiment is characterised in that the bottom die (14) forms a depression. The plate (23) that supports the semiconductor chip (1) and bonding wires (20) is positioned in this depression, and the upper die (13) presses onto this plate (23). In this state, the cavity (16) is filled with epoxy resin from a gate (17) in accordance with the transfer molding method, and the molded resin unit (8) formed.

Figure 14A:
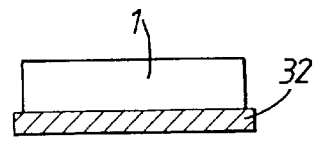
FIGS. 14(a), 14(b) and 14(c) show cross sections of steps-in the production of the molded semiconductor device of Embodiment 3.
Figure 14B:
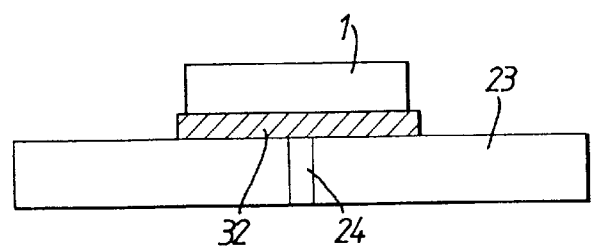
Figure 14C:
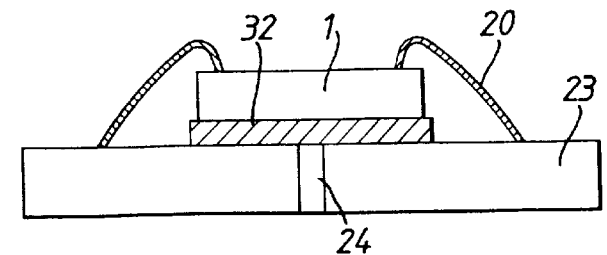

Next, the third Embodiment will be described with reference to FIGS. 14 and 15.

These figures show cross sections of the molded semiconductor device at stages of the manufacturing process. A metal sheet (32) made of copper alloy, or the like, is adhered in advance to the semiconductor chip (1) (FIG. 14 (a)). The electrode pads on the main surface of the semiconductor chip (1) are not shown as they have the same structure as the electrodes of the semiconductor chip shown in FIG. 4, etc. In the centre of the-plate (23) of the semiconductor production device used to produce this semiconductor device there is through-hole (24) which is smaller than the semiconductor chip (1) loaded onto the plate (23). After the semiconductor chip (1) has been loaded on by means of the metal sheet (32), the semiconductor chip (1) and this metal sheet (32) are secured in position by suction due to the application of a vacuum to the metal sheet (32) through the through-hole (FIG. 14(b)). The semiconductor chip (1) is adhered to the metal sheet (32) by means of adhesive, or the like. In this state, the electrode pads (not shown) and one end of the bonding wires (20) are joined using a bonding tool (not shown), and the other ends of the bonding wires (20) are temporarily attached to the plate (23) (FIG. 14(c)). For the plate (23), a metal plate, heat resistant plastic plate or glass plate is used. To attach temporarily the tips of the bonding wires (20) to the plate (23), there is carried out, for example, attachment by means of metal bonding between the bonding wires (20) and the plating on the plate surface. Or, the tips of the bonding wires are attached to the plate (23), using polyimide or epoxy resin, or some other synthetic resin, The method shown in FIG. 9 involving the use of solder paste may also be used.

Next, with the electrode pads (5) joined to one end of the bonding wires (20) and the other ends of the bonding wires (20) temporarily attached to the plate (23), the plate (23) on which the semiconductor chip (1) is fixed is inserted into the resin die. Then using, for example, the transfer molding method, the die is filled with fluid resin. As a result, a molded resin unit (8) is formed which encases the semiconductor chip (1), metal sheet (32) and bonding wires (20) on top of the plate (23) (FIG. 15(a)). After removing the molded product from the die, the plate (23) is separated from the molded resin unit (8). As a result the areas of contact between the bonding wires (20) and the plate (23) are exposed on the surface of molded resin unit (8). At the same time the bottom surface of the metal layer sheet (32) is exposed from the molded resin unit (8) (FIG. 15(b)). These exposed tip parts of the bonding wires (20) are used as the semiconductor device's connecting electrodes. Moreover, connecting electrodes (21) such as solder balls and the like may be formed on these exposed parts (FIG. 15 (c)).

In this Embodiment, since the metal sheet (32) is adhered to the semiconductor chip (1) in advance, the back surface of the semiconductor chip (1) is not exposed, and a package with high reliability can be provided. In addition, since the metal sheet (32) is exposed, this can be used as a heat sink.

Figure 17A:
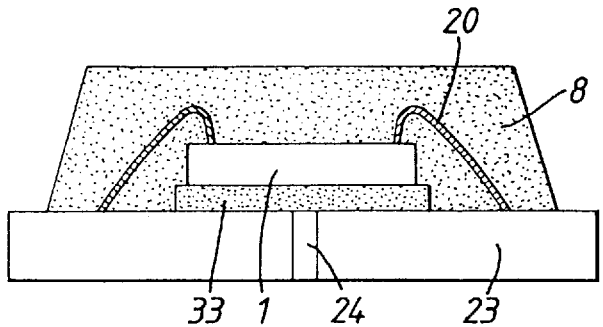
FIGS. 17(a), 17(b) and 17(c) shows cross sections of steps in the production of the molded semiconductor device of Embodiment 4.
Figure 17B:
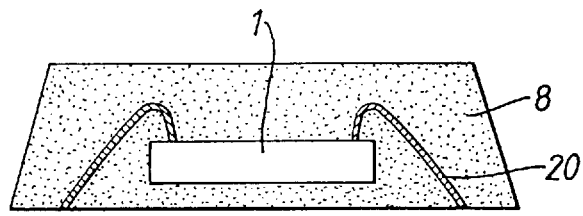
Figure 17C:
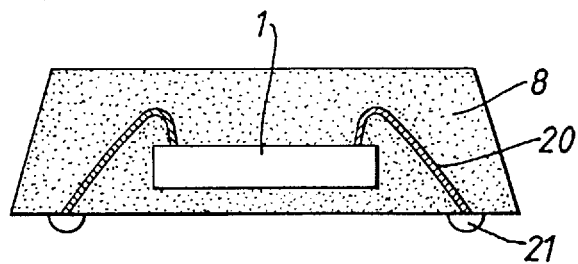

Next, the fourth Embodiment will be described with reference to FIGS. 16 and 17.

The figures show cross sections of the molded semiconductor device at stages of the manufacturing process. Before starting an epoxy resin or silicone sheet (resin board) (33) is positioned in the centre of a plate (23). In the centre of this, there is a through-hole (24) that is smaller than the semiconductor chip (1) to be loaded on plate (23). A vacuum is applied via this through-hole (24) and the resin sheet (33) held onto the plate (23) by suction (FIG. 16(a)). Next the semiconductor chip (1) is loaded on top of the resin sheet (33) that is held securely on top of the plate (23) (FIG. 16(b)). The electrode pads on the main surface of the semiconductor chip (1) are not shown as they have the same structure as the electrodes of the semiconductor chip shown in FIG. 4, etc. In this state, the electrode pads (not shown) and one end of the bonding wires (20) are joined using a bonding tool (not shown), and the other ends of the bonding wires (20) are temporarily attached to the plate (23) (FIG. 16(c)). For the plate (23), a heat resistant plastic sheet, glass sheet or plated metal sheet is used. To attach temporarily the tips of the bonding wires (20) to the plate (23), there is carried out, for example, attachment by means of metal bonding between the bonding wires (20) and the plating of the plate surface. Or, the tips of the bonding wires are attached to the plate (23) using polyimide or epoxy resin, or same other synthetic resin. The method shown in FIG. 9 involving the use of solder paste may also be used.

Next, with bonding wires (20) temporarily attached to the plate (23), the plate (23) on which the semiconductor chip (1) is fixed is inserted into a resin die. Then using, for example, the transfer molding method, the resin die is filled with fluid resin of the same material as that of the resin sheet (33). As a result, a molded resin unit (8) is formed which encloses the semiconductor chip (1), the resin sheet (33) and the bonding wires (20) on top of the plate (32) (FIG. 17(a)). After removing the molded product from the resin die, the plate (23) is separated from the molded resin unit (8). This action causes the areas of contact between the bonding wires (20) and the plate (23) to be exposed on the surface of molded rosin unit (8). As the resin sheet (33) is composed of the same material, it combines with the molded resin unit (8) to form a single body (FIG. 17(b)). The exposed tips of the bonding wires (20) are used as the connecting electrodes of the semiconductor device. Moreover, connecting electrodes (21) such as solder balls and the like may be formed on these exposed parts (FIG. 17(c)).

Because the resin sheet (33) combines with the molded resin unit (8) to form a single body, the whole of the semiconductor chip (1) is surrounded by the molded resin unit (8), warping of the package can be prevented, and a highly reliable package provided.

Next, the fifth Embodiment will be described with reference to FIGS. 18 and 19.

Figure 18:
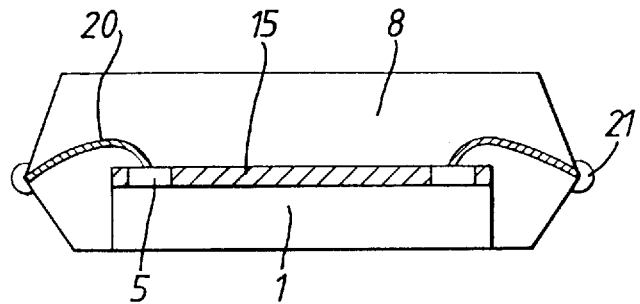
FIG. 18 shows a cross section of the molded semiconductor device of Embodiment 5.
Figure 19:
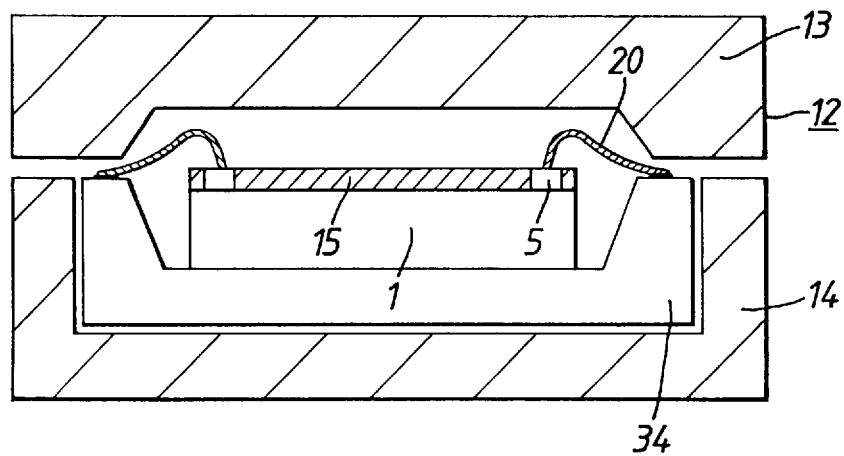
FIG. 19 shows a cross section of a resin die for carrying out the resin molding of FIG. 17.

FIG. 18 shows a cross section of a molded semiconductor device, and FIG. 19 shows a cross section of the resin die used to seal this semiconductor device in resin. With this molded semiconductor device, the connecting electrodes (21) are formed in the side of the molded resin unit (8). Because the connecting electrodes are formed in the side, there is a greater degree of freedom of positioning relative to the circuit board. To form a molded resin unit (8) in this type of situation, a plate (34) which is installed into the resin die (12) is used. This plate (34) has a depression in its centre, and the semiconductor chip (1) is loaded into this depression. In this state the electrode pads (5) on the semiconductor chip (1) and one end of the bonding wires (20) are joined using a bonding tool (not shown), and the other ends of the bonding wires (20) are temporarily attached to the plate (34). The semiconductor chip (1) is loaded into the bottom die (14) along with the plate (34). The surfaces of the semiconductor chip (1), the bottom die (14) and the plate (34) are all on the same plane. The top die (13) is fitted to the bottom die (14) and the cavity formed by these two dies is filled with fluid resin such as epoxy resin or the like by a method such as the transfer molding method, the resin is solidified, and a molded resin unit (8) such as is shown in FIG. 18 formed.

As stated above, in the present invention, after forming the molded resin unit that covers the semiconductor chip on top of a plate, this is separated from the plate, and as a result, the tips of the bonding wires are exposed on the surface of the molded resin unit. Accordingly, the molded resin unit must have an appropriate degree of adhesive strength up until the point at which the semiconductor chip is molded, and the adhered surface must be able to be easily peeled off when the plate is detached. Methods that fulfil these conditions include, for example, a method involving the oxidisation of a surface plated onto the plate surface, and a method involving reducing the thickness of the surface plating from the normal thickness, which is about 5 mm, to 1 mm or less. In addition, because it is essential that adhesion to the resin be reduced, silver plating is suitable as the plating.

In accordance with the present invention, because it is possible to cut out the time required to construct lead frames and substrates, the turn-around time and the costs can be reduced. Moreover, to the extent allowed for by the omission of lead frames and substrates, progress towards producing thinner packages is expedited. In concrete terms, a ceramic substrate, or the like, has a thickness or 0.5~1 mm, and a lead frame has a thickness of 0.1~0.2 mm, but by the use of the molded semiconductor device of the present invention, a reduction of thickness by these amounts can be expected. At the same time, because the tips of the bonding wires are exposed on the outside of the molded resin unit, the recent trend towards an increase in the number of lead frame leads can be accommodated.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A molded semiconductor device, comprising:
    a substrate made of a substrate material;
    a semiconductor ship on the substrate;
    a plurality of bonding wires each having one end coupled to the semiconductor chip and a second end; and
    a semiconductor chip on the substrate;
    a molding compound made of the substrate material, encasing the semiconductor chip and the bonding wires, wherein the second end of each bonding wire extends beyond the periphery of the substrate and is exposed directly to a surface of the molding compound.

2. The molded semiconductor device according to claim 1, wherein the another ends of the bonding wires are staggered.

3. The molded semiconductor device according to claim 1, wherein the molding compound has a top surface, a bottom surface, and a side surface, and the another ends of each of the bonding wires are exposed to the bottom surface.

4. The molded semiconductor device according to claim 1, wherein the molding compound has a top surface, a bottom surface, and a side surface, and the another ends of each of the bonding wires are exposed to the side surface.

5. The molded semiconductor device according to claim 3, further comprising:
    a ball connected to the another end of each bonding wire and coupled to an outer circuit.

6. The molded semiconductor device according to claim 4, further comprising:
    a ball connected to the another end of each bonding wire and coupled to an outer circuit.

7. A molded semiconductor device, comprising:
    a support;
    a semiconductor chip on the support;
    a plurality of bonding wires each having one end coupled to the semiconductor chip and a second end; and
    a molding compound encasing the semiconductor chip, the support, and the boding wires, wherein the second end of each bonding wire extends beyond the periphery of the support and is exposed to a surface of the molding compound.

8. The molded semiconductor device according to claim 7, wherein the another ends of the bonding wires are staggered.

9. The molded semiconductor device according to claim 7, wherein the molding compound has a top surface, a bottom surface and a side surface, and the another ends of each of the bonding wires are exposed to the bottom surface.

10. The molded semiconductor device according to claim 7, wherein the molding compound has a top surface, a bottom surface, and a side surface, and the another ends of each of the bonding wires are exposed to the side surface.

11. The molded semiconductor device according to claim 7, wherein the support comprises the same material as the molding compound.

12. The molded semiconductor device according to claim 7, wherein the support comprises metal, and a bottom surface of the support is exposed to a surface of the molding compound.

13. The molded semiconductor device according to claim 11, wherein the another ends of the bonding wires are staggered.

14. The molded semiconductor device according to claim 12, wherein the another ends of the bonding wires are staggered.

15. The molded semiconductor device according to claim 13, further comprising:
    a ball connected to the another end of each bonding wire and coupled to an outer circuit.

16. The molded semiconductor device according to claim 14, further comprising:
    a ball connected to the another end of each bonding wire and coupled to an outer circuit.

17. The molded semiconductor device according to claim 1 wherein the substrate and the molding compound combine to form a single body.

* * * * *